(12) United States Patent
Khemka et al.

(10) Patent No.: US 7,355,260 B2
(45) Date of Patent: Apr. 8, 2008

(54) SCHOTTKY DEVICE AND METHOD OF FORMING

(75) Inventors: Vishnu K. Khemka, Phoenix, AZ (US); Vijay Parthasarathy, Phoenix, AZ (US); Ronghua Zhu, Chandler, AZ (US); Amitava Bose, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 92 days.

(21) Appl. No.: 10/881,678

(22) Filed: Jun. 30, 2004

(65) Prior Publication Data

US 2006/0001057 A1 Jan. 5, 2006

(51) Int. Cl.
*H01L 27/095* (2006.01)
*H01L 29/47* (2006.01)

(52) U.S. Cl. .............. 257/471; 257/473; 438/92; 438/140

(58) Field of Classification Search ........ 257/471, 257/473, 484, 478, 335, 476
See application file for complete search history.

(56) References Cited

U.S. PATENT DOCUMENTS

| 4,989,058 | A | 1/1991 | Colak et al. |
| 5,629,535 | A | 5/1997 | Ajit |
| 6,476,442 | B1 | 11/2002 | Williams et al. |
| 6,552,406 | B1 | 4/2003 | Voldman |
| 6,617,642 | B1* | 9/2003 | Georgescu ............ 257/335 |
| 6,784,489 | B1* | 8/2004 | Menegoli ............. 257/343 |
| 6,806,548 | B2 | 10/2004 | Shirai et al. |
| 2003/0127687 | A1* | 7/2003 | Kumagai et al. ........ 257/335 |

FOREIGN PATENT DOCUMENTS

EP 1233456 8/2002

OTHER PUBLICATIONS

Agarwal A., et al., "Design of Dual Use, High Efficiency, 4H-SIC Schottky and MPS", Air Force Research Lab, Power Div., pp. 180-184, AIAA-2000-2829, Cree, Inc., Durham NC, 2000.
Shimizu, Takashi, et al., "100V Trench MOS Barrier Schottky Rectifier Usign Thick Oxide Layer (TO-TMBS)", Proceddings of 2001 International symposium on Power Semiconductor Devices & ICs, Osaka, pp. 243-246, R&D Center, Shindengen Electic Maf. Co., Saitama, Japan, 2001.

(Continued)

*Primary Examiner*—Theresa T Doan

(57) ABSTRACT

A conductive layer includes a first portion that forms a Schottky region with an underlying first region having a first conductivity type. A second region of a second conductivity type underlies the first region, where the second conductivity type is opposite the first conductivity type. A third region of the first conductivity type immediately underlies the second region and is electrically coupled to a cathode of the device.

16 Claims, 6 Drawing Sheets

OTHER PUBLICATIONS

Nunes, Benjamin, et al., "No cost" Reduced-Leakage Schottky Diode by Ion Implantation, Massachusetts Institute of Technology and Fairfield Semiconductor Corp., pp. 172-177, 1999 IEEE/SEMI Advanced Semiconductor Manufactureing Conference, 1999.

Khemka, V., et al., "A Fully Planarized 4H-SiC Trench MOS Barrier Schottky (TMBS) Rectifier", IEEE Electron Device Letter, pp. 286-288, vol. 21, No. 5. May 2000.

Smith, Jeffrey, et al., "A 0.7 um Linear Bicmos/DMOS Technology for Mixed-Signal/Power Applications", IEEE BCTM 9.4, pp. 155-157, 1997 IEEE, Texas Instruments Inc., dallas, TX, 1997.

Kunori, S., et al., "120V Multi RESURF JunctionBarrier Schottky Rectifier (MR-JCB)", pp. 97-100, 2002 IEEE, R&D Center, shindengen Electric Mfg. Co., Saitama, Japan, 2002.

U.S. Appl. No. 11/117,996, filed Apr. 29, 2004.

\* cited by examiner

SCHOTTKY DEVICE AND METHOD OF FORMING

BACKGROUND

1. Field of the Disclosure

The present disclosure relates generally to a semiconductor device and process, and more particularly to a semiconductor device having a Schottky device and process of disposing the Schottky device at a semiconductor substrate.

2. Description of the Related Arts

Conventional Schottky diodes typically have high leakage currents that increase rapidly as reverse bias voltage increases. The resulting high electric fields at the Schottky region cause the Schottky region to breakdown, potentially damaging the device. Therefore, a device and method to limit the leakage current and provide a larger breakdown voltage would be useful.

DETAILED DESCRIPTION

Lateral RESURF (reduced surface field) Schottky devices are disclosed that utilize the RESURF action to shield the Schottky region of the device from high electric fields. The Schottky device of the present disclosure is better understood with reference to FIGS. 1-13.

Figure 1:
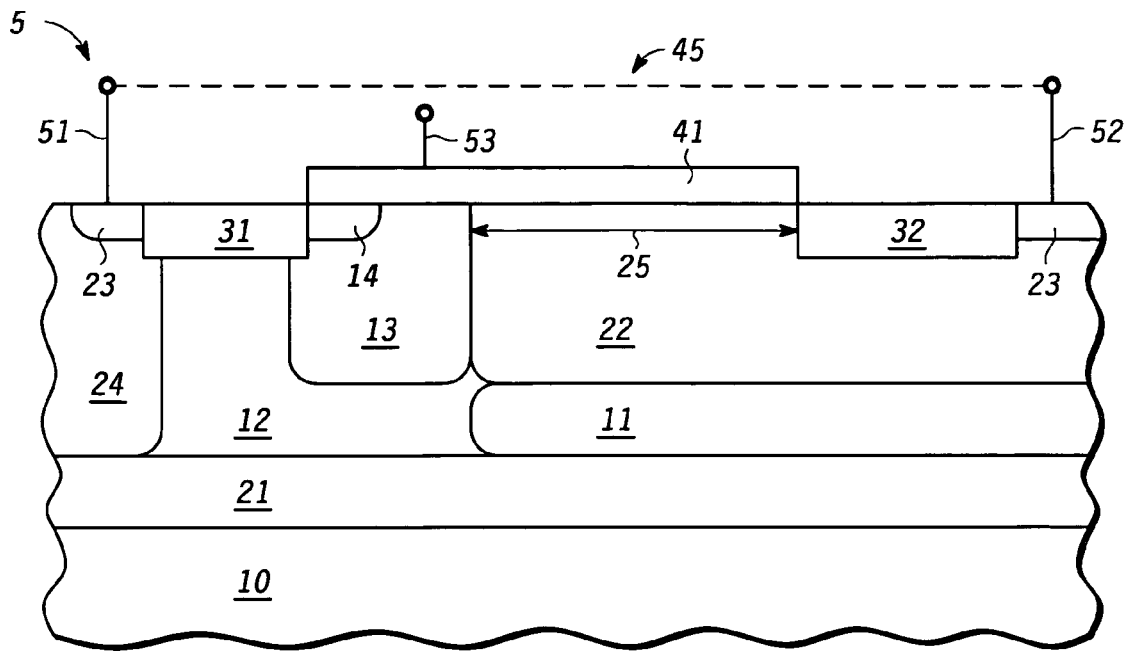
FIG. 1 illustrates a cross-sectional view of a Schottky device in accordance with the present disclosure.

FIG. 1 illustrates a cross sectional view of a Schottky device disposed at a location 5 of a bulk substrate 10 in accordance with a specific embodiment of the present disclosure. FIGS. 2-12 herein disclose specific processing flows for forming the Schottky device of FIG. 1.

Figure 2:
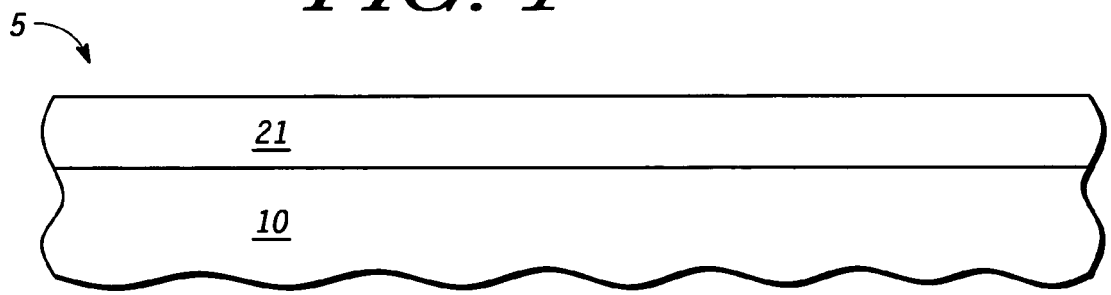
FIGS. 2-9 illustrate the Schottky device of FIG. 1 at various stages of a manufacturing process in accordance with the present disclosure.

FIG. 2 illustrates a bulk substrate 10 that includes an upper layer 21. In one embodiment, the bulk substrate 10 is a P-doped mono-crystalline substrate semiconductor substrate, such as silicon. However, the bulk substrate 10 can include other embodiments, e.g., silicon-on-insulator, silicon on sapphire, gallium arsenide, and the like. In one embodiment, a bulk substrate 10 of silicon having a P-type doping concentration in the range of approximately $1e15$-$1e19/cm^3$ is used, while the layer 21 is a doped portion of the substrate having a conductivity-type opposite that of the bulk material. For example, layer 21 can be an N-doped layer having a doping concentration in the range of approximately $1e18$-$3e19/cm^3$, with a typical range of $1$-$2x1e19/cm^3$.

In one embodiment, the layer 21 is to create an N-type buried layer (NBL) in the final device, and can be formed by implanting an N-type species, such as antimony, using known dopant implantation techniques.

In an alternate embodiment, no separate layer 21 is needed. For example, a bulk substrate having an N-type dopant concentration in the range of $1e18$-$3e19/cm^3$ or $1$-$2x1e19/cm^3$ can be used without a uniquely doped upper layer 21. Therefore, in an alternate embodiment, layer 21 merely represents an upper portion of the bulk substrate 10.

Figure 3:
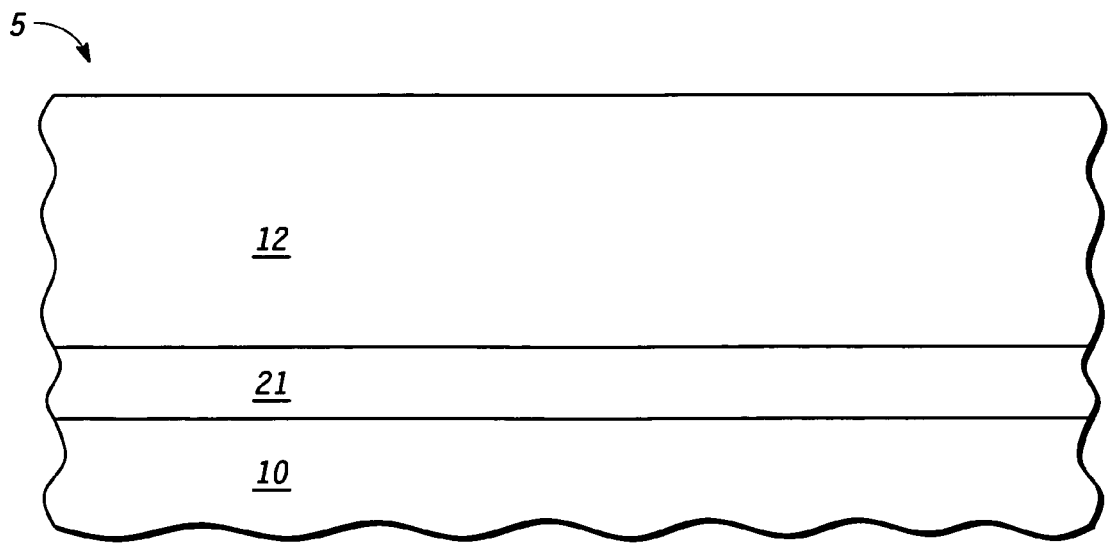

FIG. 3 illustrates location 5 subsequent to the formation of an epitaxial layer 12. Typically the epitaxial layer 12 will comprise a semiconductor material similar to that of the bulk substrate 10. For purposes of discussion, the epitaxial layer 12 is presumed to be an epitaxial silicon layer, overlying layer 21. The epitaxial layer 12 as formed has a conductivity-type opposite the layer 21, i.e. a P-doped epitaxial layer is described in the current description. In various embodiments, layer 12 has a thickness in a range of 2-4 microns, 2.5-3.5 microns, or 3.25 microns-3.75 microns. A typical P-type dopant concentration of layer 12 is in the range of approximately $2$-$5e15/cm^3$. In one embodiment, implanting the dopant species subsequent to epitaxial formation forms the doped epitaxial layer 12. In another embodiment, the dopant species is provided during epitaxial formation. Though the specific embodiment of FIGS. 2 and 3 disclose an epitaxial layer overlying a bulk substrate, it will be appreciated that the use of an epitaxial layer is not needed to create the Schottky device the present disclosure. For example, layer 10 can be an unprocessed bulk substrate, while layers 21 and 12 can be doped portions of the bulk substrate.

Figure 4:
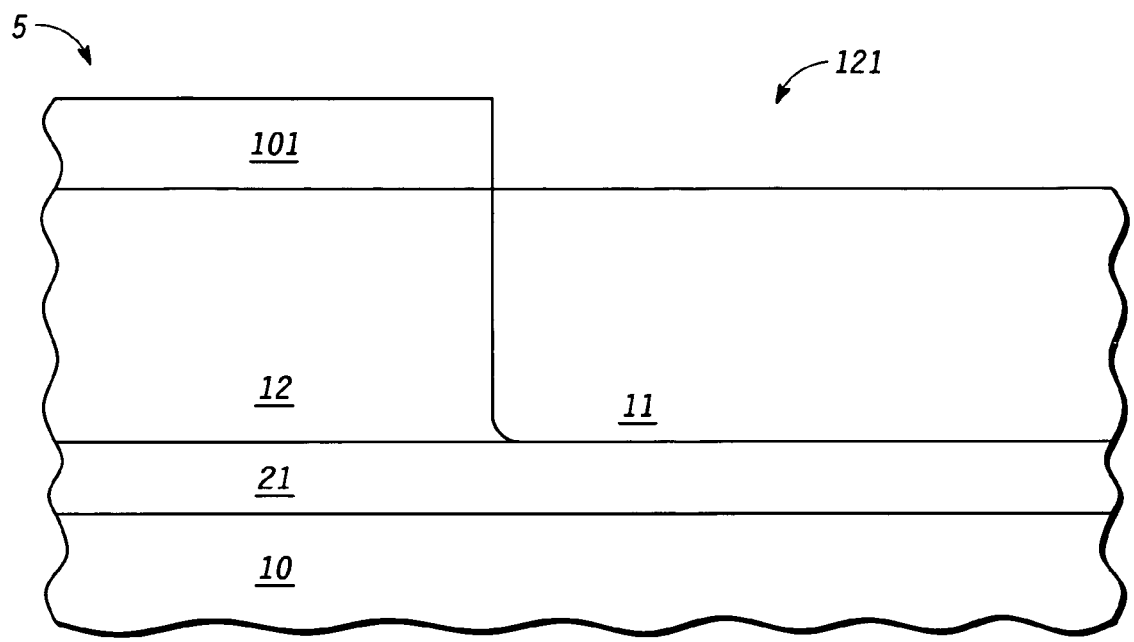

FIG. 4 illustrates location 5 subsequent to the formation of a mask layer 101. Mask layer 101 has an opening 121 (partially illustrated) that defines the location of one or more well regions to be formed having a conductivity-type opposite that of the epitaxial layer 12. Region 11 is a doped region of the same conductivity-type as epitaxial layer 12, though more heavily doped. For example, region 11 can have a doping concentration in the range of $1$-$5e16/cm^3$ or a range of $2$-$3e16/cm^3$. As illustrated in FIG. 1, only the lower portion of region 11 will remain in the final Schottky device. In one embodiment layer 11 is formed by implanting a P-type species, such as Boron.

Figure 5:
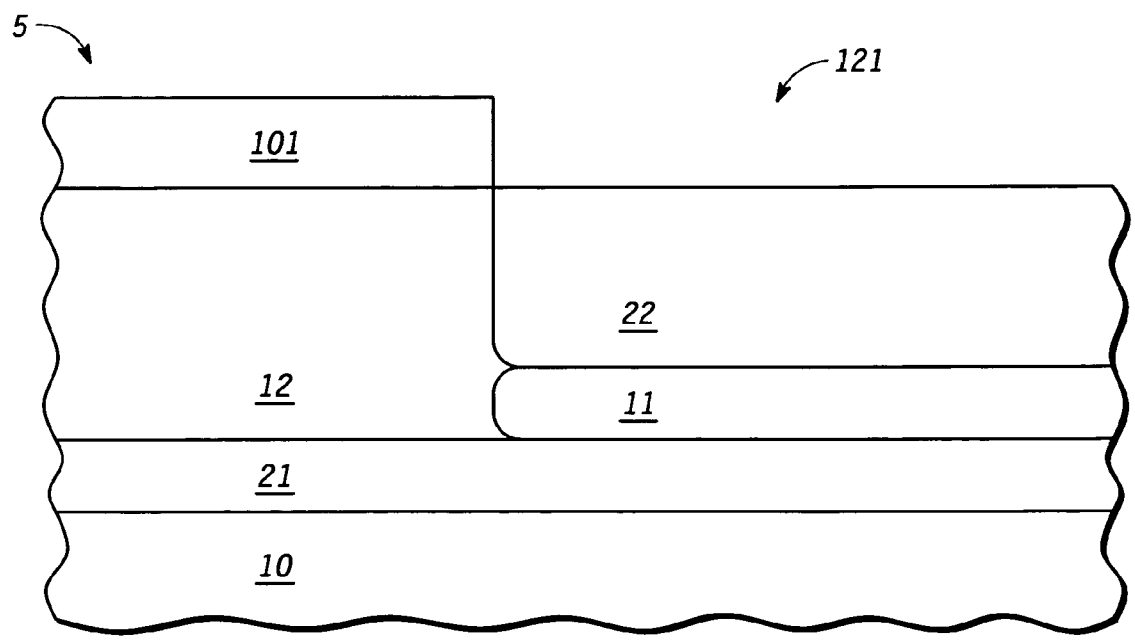

FIG. 5 illustrates location 5 subsequent to the formation of N-type region 22, which includes the drift region for the Schottky device of FIG. 1. The region 22 is typically formed using the same mask layer 101 as the region. Region 22 is formed within a region having an opposite conductivity type. For example, when region 22 is an N-type region, it is formed within and adjacent to a P-type region that is the combination of regions 11 and 12. The dopant concentration of N-well 22 is approximately $2$-$4e16/cm^3$, and can be formed by implanting phosphorous subsequent to formation of region 11. It will be appreciated that multiple well regions can be formed simultaneously on the same semiconductor device using the process described. In a particular embodiment, wells similar to region 22, will contain logic devices. The Schottky region is disposed of at region 22 to provide voltage blocking capability during reverse bias conditions and good on-resistance characteristics when forward biased as will be discussed in great detail herein.

Figure 6:
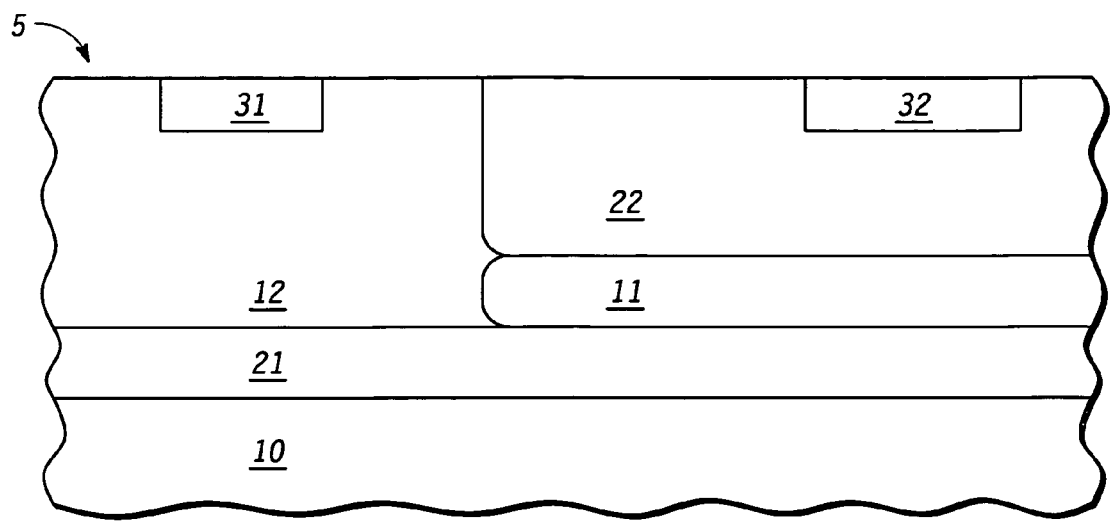

FIG. 6 illustrates location 5 subsequent to the formation of dielectric regions 31 and 32 within regions 12 and 22 respectively. Typically, the dielectric regions 31 and 32 are oxide regions formed using any suitable shallow trench isolation process. In an alternate embodiment, dielectric regions 31 and 32 can be formed on the regions 12 and 22.

Figure 7:
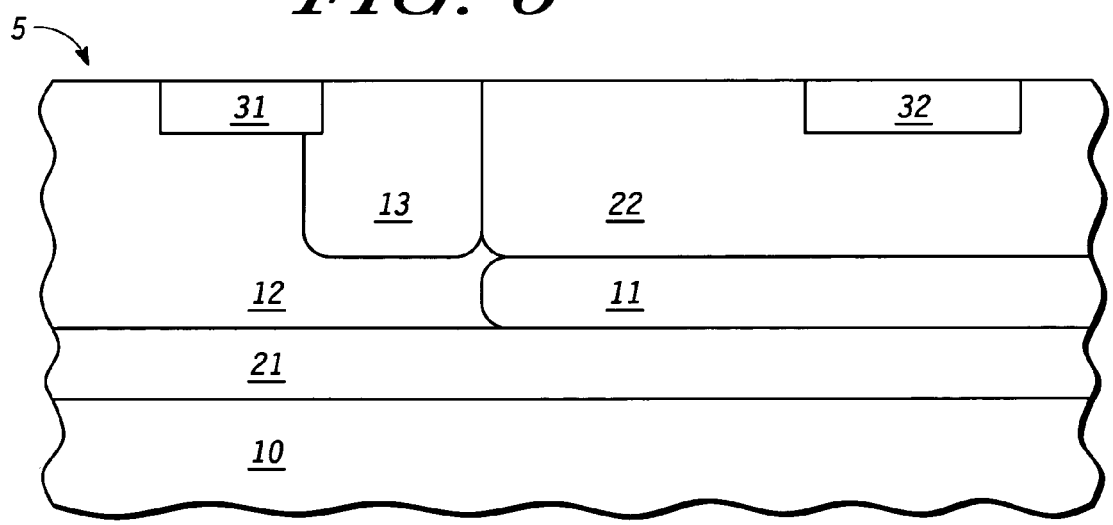

FIG. 7 illustrates location 5 subsequent to the formation of a region 13 of the same conductivity type as region 12. For example, region 13 can be a P-type region formed using known masking techniques. In a specific embodiment, P-type region 13 is referred to as a P-body, and will have a dopant concentration greater than region 12 of approximately $1$-$5e17/cm^3$, and can be formed by implanting a P-type species, such as Boron. The region 12, as illustrated, is immediately adjacent to region 22, however, portions of region 12 may reside partially, or entirely between regions 13 and 22.

Figure 8:
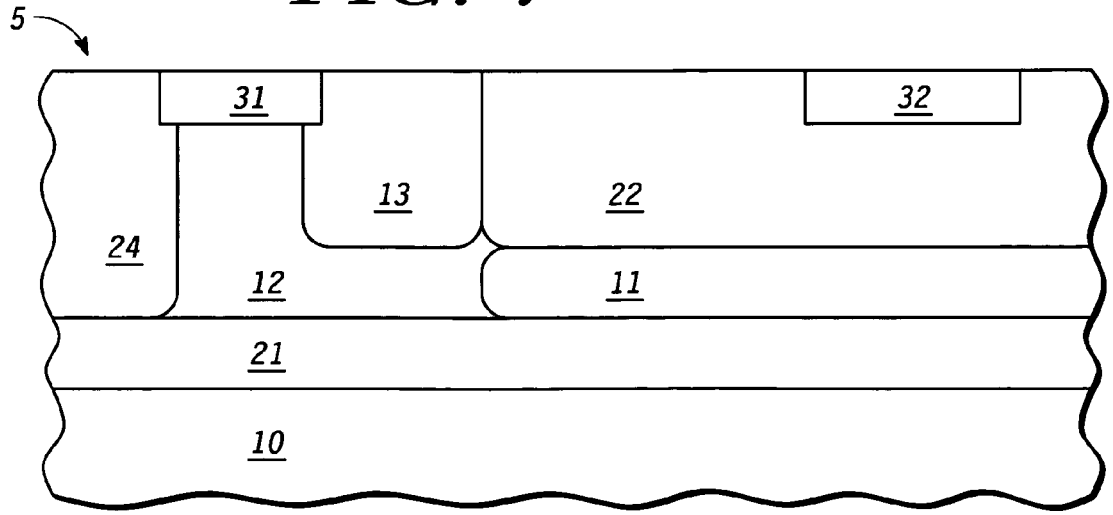
Figure 9:
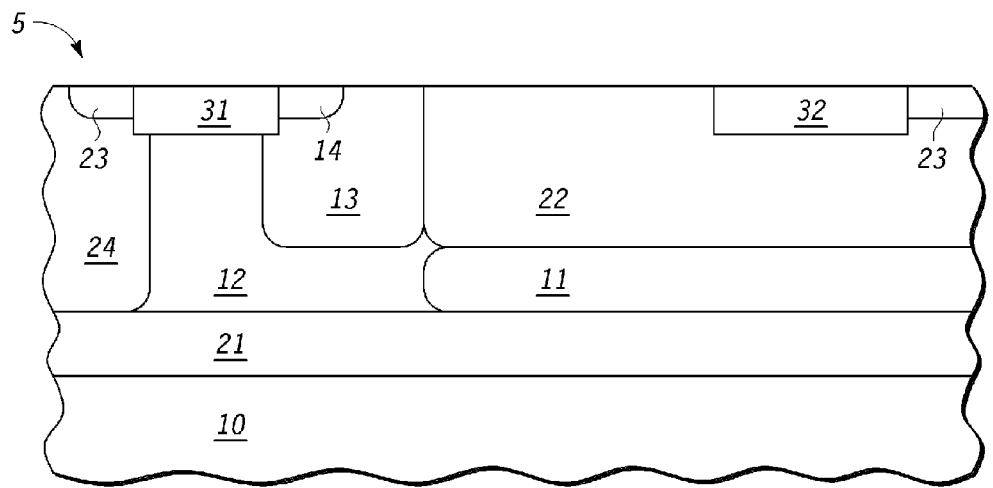

FIG. 8 illustrates location 5 subsequent to the formation of the doped region 24. Doped region 24, also referred to as a sinker, has a conductivity-type (polarity) that is the same as the layer 21, and is thereby electrically coupled to the buried layer 21. The dopant concentration of region 24 is typically larger then that of buried layer 21, and is in the range of 1e17 to 1e19/cm^3. In one embodiment, region 24 is formed by implanting an N-type species, such as phosphorus. FIG. 9 illustrates location 5 subsequent to formation of doped regions 14 and 23. Doped regions 23 create contacts referred to as ties to commonly doped regions 24 and 22. Doped region 14 creates a tie to region 13, where regions 13 and 14 are of the same conductivity-type. Typical dopant concentrations of the regions 14 and 23 are in the range of approximately 5e19-1e20/cm^3.

FIG. 1 illustrates location 5 subsequent to the formation of a conductive layer 41, a portion of which is a Schottky contact to the region 22 in that it has an appropriate work function differential between itself and the underlying region 22 to form a Schottky region 25. In one embodiment, the conductive layer 41 is a silicide 41 formed by the deposition and anneal of Cobalt metal. A terminal 53 is illustrated connected to the silicide 41. The term "terminal" is used broadly to indicate a conductive element or portion of a conductive element that interfaces to a portion of the Schottky device of FIG. 1. A terminal will typically have conductivity greater than the regions of the Schottky device to which it contacts. For example, a contact via or conductive trace formed of a metal or heavily doped poly silicon, will typically form a terminal. In one embodiment, the silicide 41 is a portion of the conductive structure that forms the anode of the Schottky device, while a terminal 52 is a portion of a conductive structure that interfaces with well tie 23 and forms the Schottky cathode.

Note that FIG. 1 also illustrates a connection 45, which is a conductive connection, such as a metal trace, connecting the tie 23 of region 22 to the tie 23 of region 24. The terminals 51 and 52 may be considered part of the connection 45, or separate from the connection 45. In an alternate embodiment, the connection 45 can be replaced with a connection between the anode 53 and the tie 23 to region 24 as will be discussed further herein.

The silicide 41 is in contact with a first region and a second region of opposite conductivity types. In one embodiment, the first region is a P-type region formed by regions 11, 12, 13 and 14, while the second region is a N-type region formed by regions 22 and 23. Terminal 52 of the Schottky device is electrically coupled to the region 22 through the tie region 23. At least a portion of the P-type region 11 immediately underlies the region 22 and is in electrical contact with the silicide 41 through P-type regions 12, 13 and 14.

Figure 10:
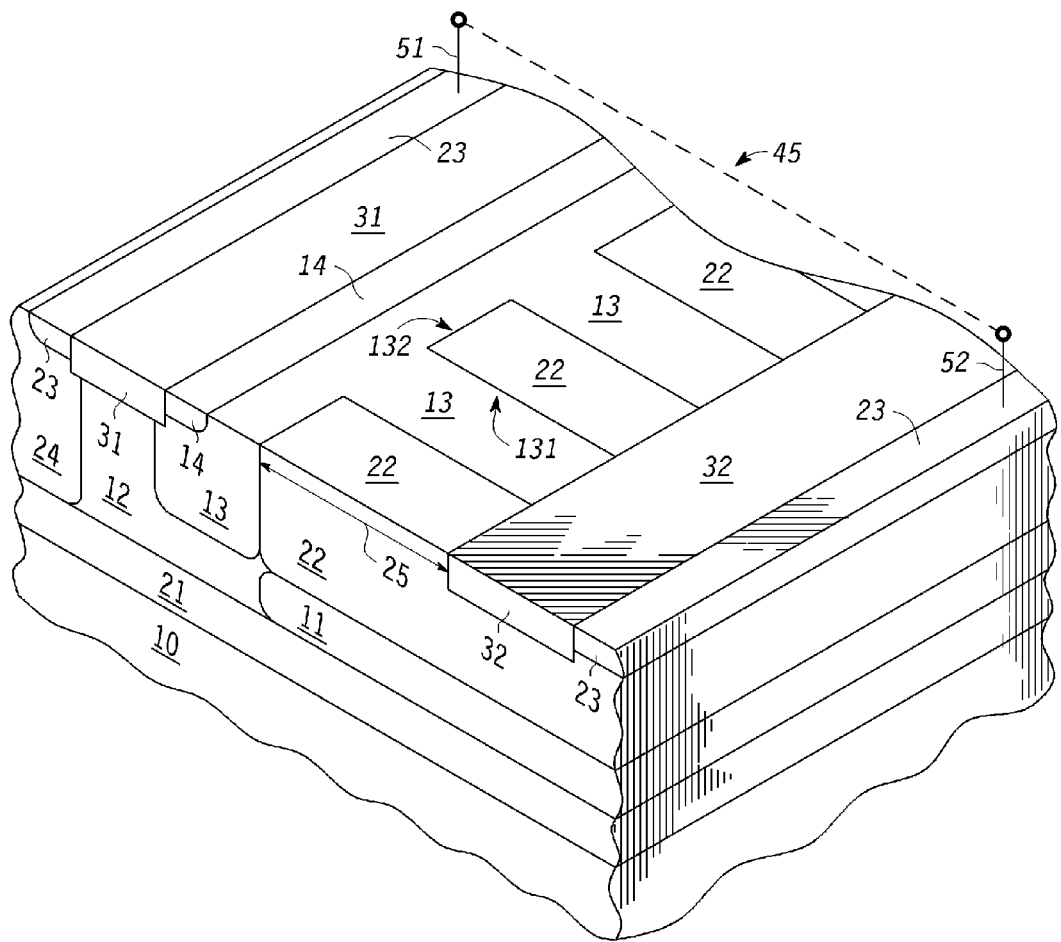
FIGS. 10 and 11 illustrate three-dimensional views of the Schottky device of FIG. 1 in accordance with specific embodiments of the present disclosure.

FIG. 10 illustrates a three-dimensional representation of a specific embodiment of a Schottky device. Note, the silicide 41 is not illustrated for purposes of clarity and would typically overly the interleaved structures between the isolation regions 31 and 32, and be in contact with terminal 53 (such as shown in FIG. 1). More specifically, FIG. 10 illustrates interleaved structures formed from regions 13 and 22, as viewed from a plan view of the Schottky device. For example, a common interface location 131 is shared between an interleave structure of region 22 and an interleave structure of region 13; thereby creating a planar interface that is substantially orthogonal to the upper surface of the Schottky device. Note that the common interface 131 may not be shared by regions 13 and 22 along the entire depth of the regions 12 and 22, and that part of p-type region 12 may interface with region 22, thereby separating regions 13 and 22.

The interleave structure of region 22 also shares a common interface 132 with region 13 to create generally a planar interface that is substantially orthogonal to the upper surface of the Schottky device and to the planar interface beginning at common edge 131. Note that the regions 11, 12, and 13 make a region having a common conductivity type, and that a substantially planar interface is formed between an interleave structure of region 22 and the underlying region 11. This interface is substantially orthogonal to the planar interfaces beginning at common edges 131 and 132. In one embodiment, the P-type interleave structures of region 13 extend to the buried layer 11. In an alternate embodiment, the P-type interleave structures of region 13 stop within the region 22. As used herein, substantially orthogonal planes include planes at 90-degree angles, 85-95 degree angles, and 80-100 degree angles, relative to each other.

Figure 11:
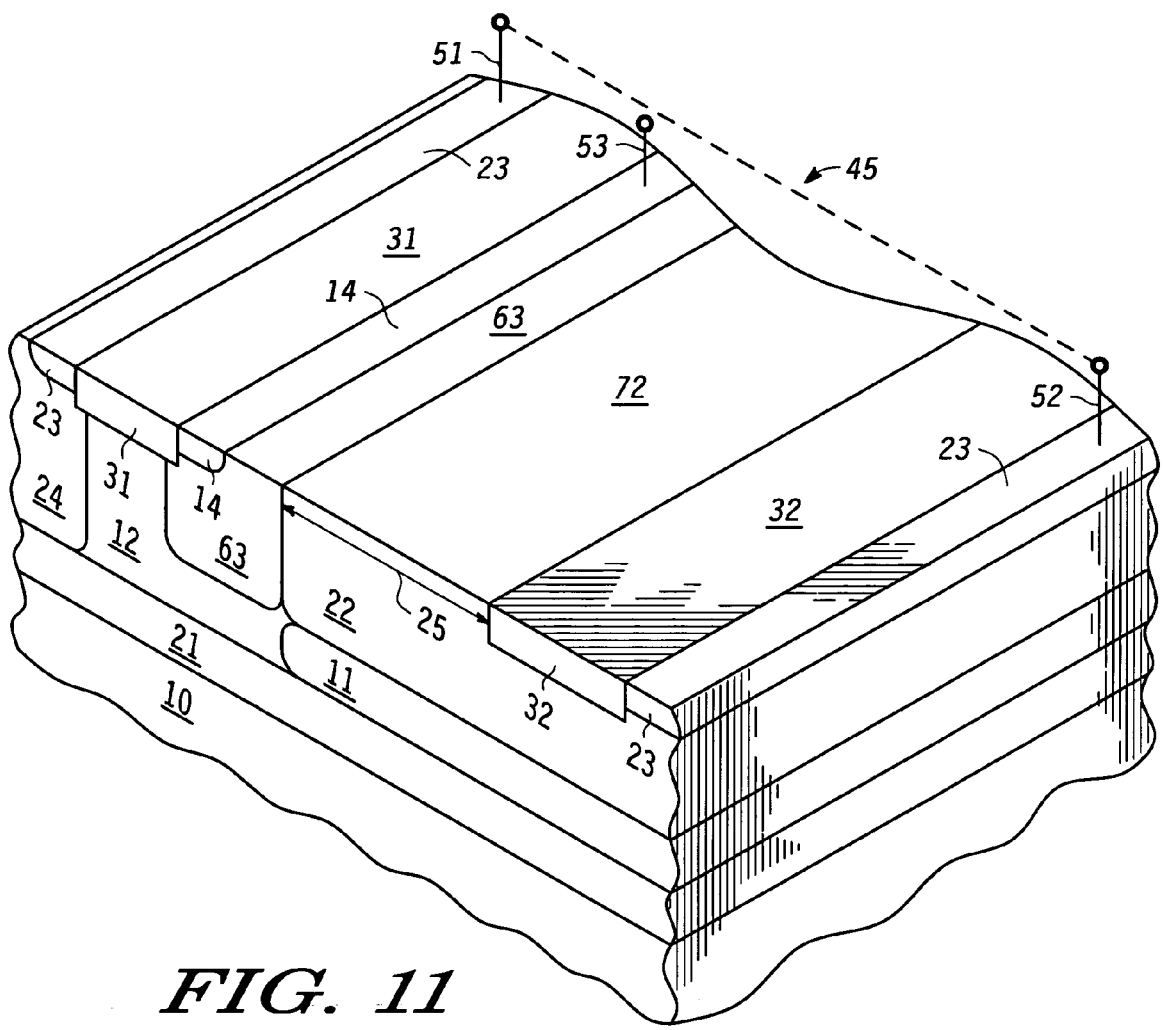

FIG. 11 illustrates a three-dimensional view of an alternate embodiment of the present disclosure. Specifically, FIG. 11 illustrates a Schottky device similar to that described at FIG. 10. However, instead of having the interleaved structures of regions 13 and 22, non-interleaved regions 63 and 73 are illustrated that are analogous to regions 13 and 22 without interleave structures.

In operation, the disclosed Schottky device of FIG. 1 conducts current from the anode 53 to the cathode 52 when forward biased. However, a Schottky region 25 formed in the N-type region 22 underlying the silicide 41, limits current flow in the reverse direction during a reverse bias condition. During a reverse bias condition, the Schottky device of FIG. 1 forms a depletion region that extends into the region 22 from multiple directions. First, the region 22 is depleted from left-to-right, i.e. the region 13 as illustrated in FIG. 1. Second, the region 22 is depleted into and out of the page illustrating FIG. 1 when the regions 13 and 22 are interleaved. These first and second depletion actions cause a single-RESURF (Reduced Surface Field) action in that they deplete region 22 in a direction parallel to a plane that is substantially parallel with the interface between region 22 and silicide 41. Finally, because the Cathode 52 is electrically connected to the buried layer 21 through region 24, the region 11 is depleted during reverse bias, thereby enhancing the depletion of the region 22 during reverse bias in a second plane substantially orthogonal to the plain formed by the interface between region 22 and silicide 41. When depletion action from below is included, the effect is referred to as a double-RESURF action.

The depletion region created from left-to-right in the region 22 during reverse bias will extend past the Schottky region underlying the silicide 41 to the isolation region 32 as the reverse bias voltage increases. This extension of the depletion region past the Schottky region substantially clamps the electric field seen the Schottky region as the reverse bias voltage increases, and hence limits the reverse leakage current through the Schottky region. As a result of this clamping effect, the Schottky device of FIG. 1 is substantially less susceptible to high leakage current in reverse bias conditions than conventional devices.

In an alternate embodiment, the anode 53, instead of the cathode 52, of the Schottky device can be connected to the tie 23 of region 24. In this configuration, a reverse bias voltage will not result in the depletion of region 11 or the double RESURF action from the bottom of layer 22.

Figure 12:
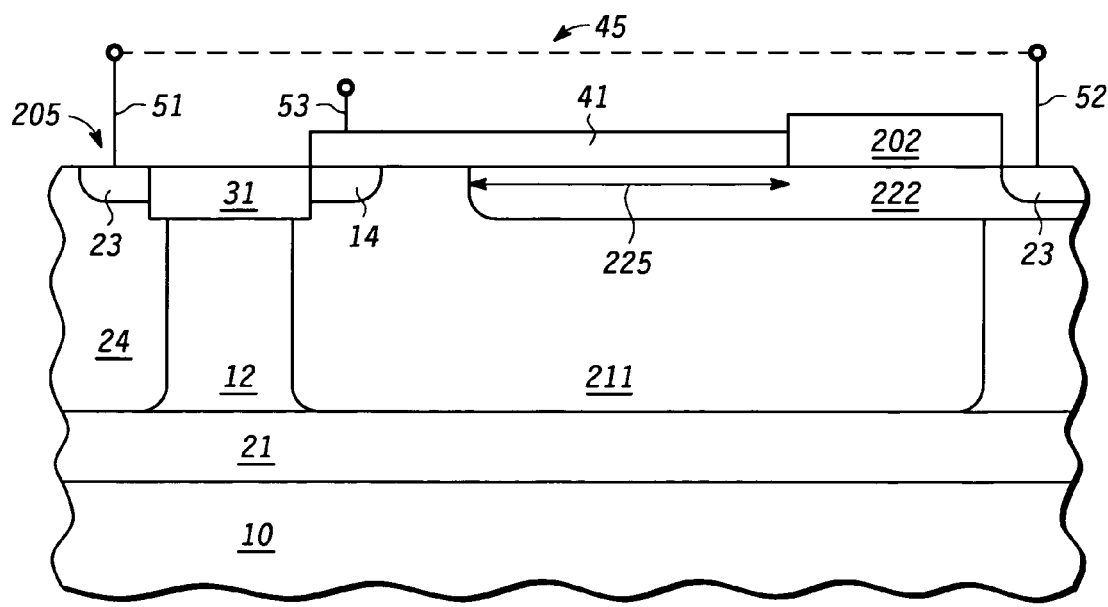
FIGS. 12-14 illustrate cross-sectional views of Schottky devices in accordance with alternate embodiments of the present disclosure.

FIG. 12 illustrates a cross-sectional view of an alternate embodiment of the present disclosure. Specifically, the Schottky device of FIG. 12 is similar to the Schottky device of FIG. 1, and analogous regions are commonly numbered. However, instead of implementing separate layers 11 and 13 having a common conductivity type, only a single region 211 is implemented. A dielectric layer 202 is disposed prior to formation of the silicide 41 and separates the tie region 23 from the Schottky region 225. A N-type region 222 is disposed within the epitaxial layer 12 and overlies a portion of P-type region 211. Note that the N-type region 222 has been illustrated as significantly thinner than the N-type region 22 of previous embodiments to emphasis the fact that the thickness of the N-type region can vary from embodiment to embodiment. Subsequent to formation of the silicide 41 a Schottky region will result at the N-type region 222. Operation of the device of FIG. 12 is similar to that of FIG. 1, wherein depletion occurs in the lateral direction to protect the Schottky region during high-voltage reverse bias conditions.

Figure 13:
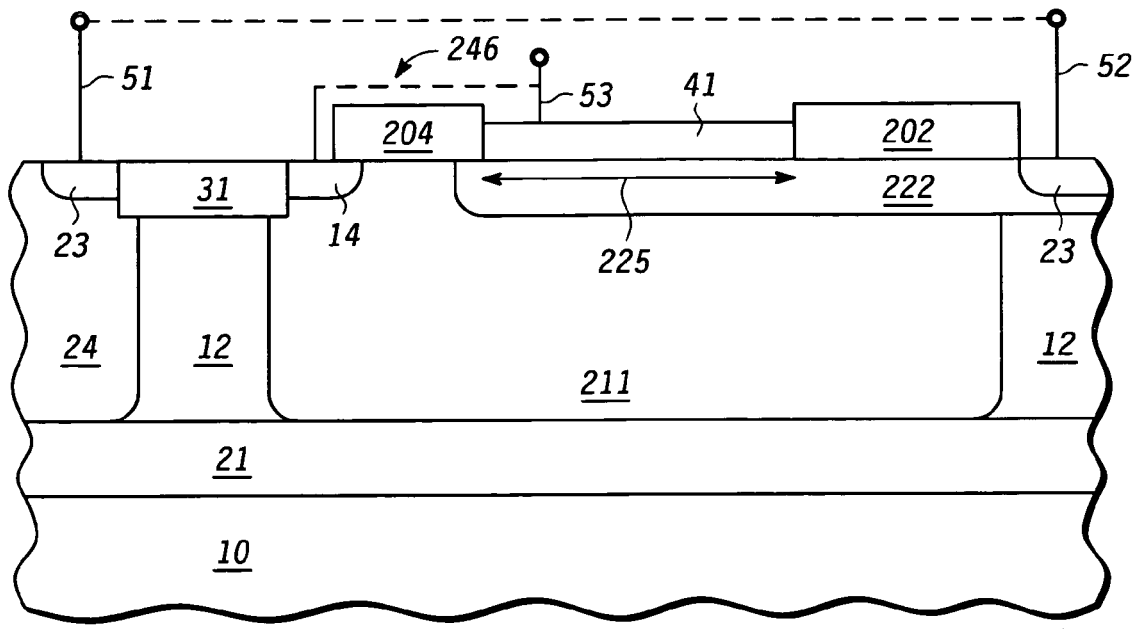

FIG. 13 illustrates a cross-sectional view of an alternate embodiment of the present disclosure. Specifically, the Schottky device of FIG. 13 is similar to the Schottky device of FIG. 1. Analogous regions between FIGS. 12 and 13 are commonly numbered. The Schottky device of FIG. 13 differs from the Schottky device of FIG. 12 in that a dielectric spacer 204 is disposed over the P-type region 211 between region 31 and silicide 41. In this manner, the length of Schottky region 225 is the distance between the dielectric spacers 202 and 204. A conductive connection 246 connects the silicide 41 the tie region 14.

Figure 14:
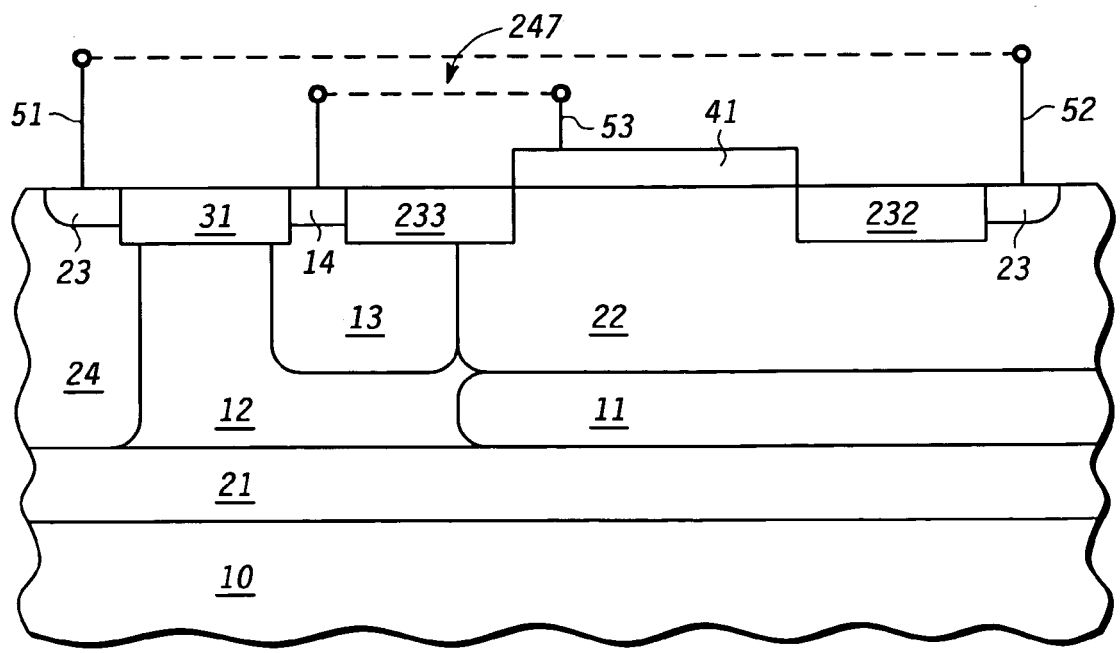

FIG. 14 illustrates a cross-sectional view of an alternate embodiment of the present disclosure. Specifically, the Schottky device of FIG. 14 is similar to the Schottky device of FIG. 10. Analogous regions between FIGS. 14 and 10 are commonly numbered. The Schottky device of FIG. 14 differs from the Schottky device of FIG. 10 in that a dielectric spacer 233 is disposed over the substrate 10 within region 13 and 22. In this manner, the length of Schottky region 225 is the distance between the dielectric spacers 233 and 232. A conductive connection 247 connects the silicide 41 the tie region 14.

The method and apparatus herein provide for a flexible implementation. Although described using certain specific examples, it will be apparent to those skilled in the art that the examples are illustrative, and that many variations exist. For example, various types of deposition and doping techniques and devices are currently available which could be suitable for use in employing the method as taught herein. Note also, that although an embodiment of the present disclosure has been shown and described in detail herein, along with certain variants thereof, many other varied embodiments that incorporate the teachings of the disclosure may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

The invention claimed is:

1. A device comprising:
   a first terminal connected to a conductive layer, a first portion of the conductive layer being a Schottky contact;
   a first region of a first conductivity type underlying the Schottky contact, a first portion of the first region immediately underlying the Schottky contact;
   a second region of a second conductivity type underlying the first region, a first portion of the second region immediately underlying the first portion of the first region, the second conductivity type being opposite the first conductivity type;
   a third region of the first conductivity type underlying the second region, a first portion of the third region immediately underlying the second region;
   a second terminal overlying the first region and electrically connected to the first region and to the third region; and
   a fourth region of the second conductivity type adjacent to the first region in a lateral direction, the fourth region electrically connected to the first terminal, a first portion of the fourth region immediately adjacent in a lateral direction to the second region, wherein the second region is electrically connected to the conductive layer through a tie-portion of the fourth region, and the tie-portion of the fourth region comprises a higher dopant concentration than other portions of the fourth region.

2. The device of claim 1 wherein a second portion of the fourth region immediately underlies a second portion of the conductive layer.

3. The device of claim 2, wherein the second portion of the conductive layer is immediately adjacent in a lateral direction to the first portion of the conductive layer.

4. The device of claim 3, wherein a third portion of the fourth region is immediately adjacent to the first region, and has a higher dopant concentration of the second conductivity type than the first portion of the fourth region.

5. The device of claim 1, wherein the fourth region does not immediately underlie the conductive layer.

6. The device of claim 1, wherein a second portion of the fourth region overlies the first portion of the fourth region, wherein the second portion of the fourth region comprises a higher dopant concentration than the first portion of the fourth region, and the tie-portion of the fourth region is part of the second portion of the fourth region that is immediately adjacent to the conductive layer.

7. The device of claim 6, wherein the first portion of the fourth region is physically separated from the tie-portion of the fourth region by the second portion of the fourth region.

8. The device of claim 1, wherein the third region is electrically connected to the first region.

9. The device of claim 8, wherein the third region is electrically connected to the first region through a conductive path at least as conductive as the third region.

10. The device of claim 1, wherein
    the first region comprises a plurality of first interleave structures; and
    the fourth region comprises a plurality of second interleave structures interleaved with the plurality first interleave structures.

11. The device of claim 1, wherein the first region and the second region form a first planar interface facing a first direction and the first region and the fourth region form a second planar interface facing a second direction, the first direction and the second direction being substantially orthogonal.

12. The device of claim 11, wherein the first region and the fourth region form a third planar interface facing a third direction, the third direction and the first direction being substantially orthogonal and the third direction and second direction being substantially orthogonal.

13. The device of claim 1, wherein the conductive layer is a silicide.

14. The device of claim 1, wherein the first terminal is an anode of the Schottky contact and the second terminal is a cathode of the Schottky contact.

15. The device of claim 1, wherein the first terminal is a cathode of the Schottky contact and the second terminal is an anode of the Schottky contact.

16. A device comprising:

a first terminal connected to a conductive layer, a first portion of the conductive layer being a Schottky contact;

a first region of a first conductivity type underlying the Schottky contact, a first portion of the first region immediately underlying the Schottky contact;

a second region of a second conductivity type immediately underlying the first portion of the first region, the second conductivity type being opposite the first conductivity type;

a third region of the first conductivity type immediately underlying the second region;

a second terminal overlying the first region and electrically connected to the first region and to the third region; and a fourth region of the second conductivity type adjacent to the first region in a lateral direction, the fourth region electrically connected to the first terminal, a first portion of the fourth region immediately adjacent in a lateral direction to the second region, wherein the second region is electrically connected to the conductive layer through a tie-portion of the fourth region, and the tie-portion of the fourth region comprises a higher dopant concentration than other portions of the fourth region.

* * * * *